United States Patent
Chen

(10) Patent No.: US 7,263,004 B2
(45) Date of Patent: Aug. 28, 2007

(54) METHOD AND APPARATUS FOR DETERMINING SENSING TIMING OF FLASH MEMORY

(75) Inventor: Chung Zen Chen, Hsinchu (TW)

(73) Assignee: Elite Semiconductor Memory Technology Inc., Hsinchu (TW)

(*) Notice: Subject to any disclaimer, the term of this patent is extended or adjusted under 35 U.S.C. 154(b) by 105 days.

(21) Appl. No.: 11/297,527

(22) Filed: Dec. 8, 2005

(65) Prior Publication Data
US 2007/0133304 A1 Jun. 14, 2007

(51) Int. Cl.
*G11C 11/34* (2006.01)
(52) U.S. Cl. .............. 365/185.25; 365/185.2
(58) Field of Classification Search ........... 365/185.25, 365/185.2, 185.17
See application file for complete search history.

(56) References Cited

U.S. PATENT DOCUMENTS

| | | | |
|---|---|---|---|
| 5,754,475 A | 5/1998 | Bill et al. | |
| 6,304,486 B1 | 10/2001 | Yano | |
| 6,480,419 B2 * | 11/2002 | Lee | 365/185.18 |
| 6,512,694 B2 * | 1/2003 | Herdt | 365/185.17 |
| 6,671,204 B2 | 12/2003 | Im | |
| 6,925,005 B2 * | 8/2005 | Kawamura et al. | 365/185.12 |
| 7,193,898 B2 * | 3/2007 | Cernea | 365/185.22 |

OTHER PUBLICATIONS

Kang-Deog Suh et al., "A 3.3 V 32 Mb NAND Flash Memory with Incremental Step Pulse Programming Scheme", IEEE Journal of Solid-State Circuits, vol. 30, No. 11, Nov. 1995.

* cited by examiner

*Primary Examiner*—Anh Phung
(74) *Attorney, Agent, or Firm*—Egbert Law Offices

(57) ABSTRACT

A method of automatically determining a sensing timing in a page buffer of a NAND flash memory device is disclosed, which includes the steps of discharging a first reference bit line, discharging a second reference bit line, determining a first control signal and determining a second control signal. To perform the method, an apparatus of automatically determining a sensing timing in a page buffer of a NAND flash memory device is also disclosed. The apparatus includes a first reference bit line, a first current sink, a first reference page buffer, the second reference bit line, a second current sink and a second reference page buffer. The first reference bit line is coupled to the first current sink and the first reference page buffer at both ends thereof. The second reference bit line is coupled to the second current sink and the second reference page buffer at both ends thereof.

26 Claims, 8 Drawing Sheets

METHOD AND APPARATUS FOR DETERMINING SENSING TIMING OF FLASH MEMORY

RELATED U.S. APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates to a method for determining a sensing timing and an apparatus performing the same, more particularly, to a method and an apparatus for automatically determining a sensing timing in a page buffer of normal cells in a memory cell array of a flash memory device. The sensing timing determines the activation of the control signals to start the operation of read or verifications in the flash memory device.

BACKGROUND OF THE INVENTION

In a NAND flash memory, the data stored in a cell is read out through the page buffer. The page buffer also serves program verification and erase verification that function as a read operation. Page buffers appear in a variety of designs. FIG. 1 is one design of page buffer, which is published in "A 3.3 V 32 Mb NAND flash memory with incremental step pulse programming scheme", IEEE Journal of Solid-State-Circuit, Vol. 30, No. 11, p. 1149-1155, November 1995. The read operation is described as follows. First, the word line (not shown) switches to logic low and thus no current occurs in the cell. Then, the bit line BL is discharged to ground by turning on NMOS 102 and 103. Next, the bit line BL is charged to $V_{CC}$ by turning off NMOS 103 and 104 and turning on PMOS 101. The page buffer uses a mirrored current provided by a PMOS 101 noted as a current load to pull up the bit line BL. The mirrored current is compared with the accessed cell current on the bit line BL and thus defines the bit line voltage. If the accessed cell is in low threshold voltage (i.e., erase state), it will be turned on by the word line and has an electrical current larger than the mirrored current during read or verification. Consequently, the bit line BL will be discharged gradually and NMOS 105 is turned off. If the accessed cell is in high threshold voltage (i.e., program state), the voltage on the word line cannot turn on this cell. The mirror current will pull the bit line BL in high voltage state and NMOS 105 will be turned on. After a period of time, namely the signal development time, the cell state is sent to the latch in the page buffer by activating a "READ" pulse to turn on NMOS 106, and thus the data stored in the cell is transferred to the page buffer.

U.S. Pat. No. 6,671,204 does not use the mirrored current scheme but discloses a page buffer as shown in FIG. 2 instead, in which a bit line BLE is selected for reading and another bit line BLO used as a shielding bit line. FIG. 3 illustrates a timing diagram with reference to the schematic shown in FIG. 2. In Region 2 of FIG. 3, the bit lines BLE and BLO are discharged to ground first by turning on NMOS 201 and 203 in connection with grounded VIRPWR. The node SO is also discharged by turning on NMOS transistors 202 and 204. Then, Region 3 is active, during which BLSHFO switches to logic low, the word line WL is turned on, BLSHFE is biased at about 2.0V and PLOAD is active low. The node SO is pulled to $V_{CC}$ and charges up the bit line BLE to 2.0V-$V_{TH}$, where $V_{TH}$ is the threshold voltage of NMOS 204 and is typically about 1V. The 2.0V bias and the threshold voltage on NMOS 204 clamp the voltage level of the bit line BLE. When the voltage level of the bit line BLE is stabilized, Region 4 is active and BLSHFE is pulled to ground level to turn off NMOS 204, and namely the signal development starts on the bit line BLE. The bit line BLE will be discharged to a lower level if the accessed cell has a low threshold voltage and is turned on. In contrast, if the accessed cell has a high threshold voltage, it will not be turned on and the bit line BLE keeps the pre-charge voltage level. After the signal development time, Region 5 is active. NMOS 204 is turned on again but the voltage level of BLSHFE is around 1.3V only. This is used to sense the voltage level of the bit line BLE with respect to the node SO. The node SO with $V_{CC}$ level will be discharged to the bit line BLE if the bit line BLE is at low level, and NMOS 204 will be turned on. While the node SO remains at $V_{CC}$ level and NMOS 204 is off if the accessed cell has high threshold voltage or the bit line BLE is at 1V. The signal of the node SO will be sent to a left register 205 by activating a PBLCHM pulse signal. In this conventional scheme, a timer is required to control the activation of the PBLCHM signal. The timer will count up to a pre-determined time period, so as to ensure that the signal PLOAD goes high in Region 4. In Region 6, all bit lines and the node SO are discharged to ground again. In Region 7, all control signals of the page buffer are disabled.

U.S. Pat. No. 6,925,005 discloses a sensing method to track the memory cell position in bit line direction and word line direction. The cell array is divided into many regions. Each region has a reference bit line to control the sensing timing for this region. The reference bit line has a reference cell to each crossed word line. That is, the reference bit lines have the same connection as normal bit lines. However, this method will result in difficulty in efficiently adjusting the threshold voltages for so many reference cells. Another concern is about disturbance/drifting of the threshold voltage of the reference cell, which is caused by the adjacent normal bit lines and reference bit lines. That is, when the normal cells are programmed, the associated word lines go high and will affect the threshold voltages of the reference cells. Similarly, the drifting of the threshold voltages of the reference cells also occurs during the erase operation.

U.S. Pat. No. 6,304,486 uses a single reference bit line and a reference cell at each intersection of word lines and this single reference bit line. It means each page has a reference cell. When this reference cell passes erase verification, it will initiate the verification on normal cells. Additionally, when this reference cell passes program verification, it will initiate the program verification on normal cells. However, if one of the reference cells fails, the corresponding word line fails to access normal cells. Another concern is the reliability of the reference cells that degrade due to repeated program and erase operations with the normal cells.

U.S. Pat. No. 5,754,475, applied on multiple-level cell design, uses multiple reference bit lines. Each reference bit line has a reference cell at each intersection of word lines and reference bit line. The reference cells on each reference bit line have a pre-tuned threshold voltage during production. However, in this design, tuning the threshold voltages of the reference cells is time-consuming, increasing production cost drastically and therefore not feasible. For example, there are 32,000 word lines in a 1 Gb NAND flash memory and thus there are 96,000 reference cells in need of threshold voltage adjustment. Another concern is about disturbance/drifting of the threshold voltage of the reference cell, which is caused by the adjacent normal bit lines and reference bit lines.

In each of the conventional schemes mentioned above, a timer is required to control the activation of the control signal, e.g., the signal PBLCHM of FIG. 2, to start the operation of read or program verification; also, the timer will count up to a pre-determined time period, so as to ensure that the PLOAD signal goes high in Region 4 of FIG. 3. In practice, the sensing timing controlled by the timer is determined by simulation and then is implemented by a logic circuit. Thus, the control of the sensing timing by the timer may fail if the RC (product of resistance and capacitance) of the bit line changes due to variation of the fabrication process.

BRIEF SUMMARY OF THE INVENTION

The primary objective of the present invention is to provide a method for automatically determining a sensing time in a page buffer of normal cells in a memory cell array of a flash memory device and an apparatus performing the operation. The secondary objective of the present invention is to provide a method and an apparatus to eliminate the drifting of the threshold voltage of the reference cell during program or erase operations in a flash memory device.

In order to achieve the objectives, a method and an apparatus for determining a sensing time in a page buffer of normal cells in a memory cell array of a NAND flash memory device are disclosed. The apparatus of the present invention comprises a first reference bit line, a first current sink, a first reference page buffer, a second group of reference bit lines, a second current sink and a second reference page buffer. The first reference bit line is coupled between the first current sink and the first reference page buffer. The second group of reference bit lines are coupled between the second current sink and the second reference page buffer. Both the first and second current sinks are disposed out of the memory cell array where the normal cells and normal bit lines are located. Consequently, the drifting of the threshold voltage of the reference cells can be eliminated during program and erase operations. Each of the first and second current sinks provides the first and second reference bit lines paths to ground, respectively, and is located at the farthest end of the respective reference bit line from the respective reference page buffer.

In an embodiment, each of the first and second current sinks is implemented by a single reference cell, e.g., a NAND cell, whose control gate is connected to a reference word line. In another embodiment, each of the first and second current sinks comprises a plurality of fuse groups. Each fuse group is connected to a MOSFET in series, and the fuse groups are connected in parallel with a reference word line connected to each gate electrode of the MOSFETs. These fuses are used to tune the sink current. The reference word line of the current sink is isolated from the normal cell word lines. Accordingly, elimination of the drifting of the threshold voltages of the reference cells is enhanced during program and erase operations. Moreover, the apparatus of the present invention can further comprises a first reference shielding bit line to shield the first reference bit line and a second reference shielding bit line to shield the second reference bit line.

At first, the first reference bit line connected to the first reference page buffer is discharged to be of a first pre-determined voltage through the first current sink, so as to generate a first control signal. Then, the second reference bit line connected to a second reference page buffer is discharged to be of a second pre-determined voltage through the second current sink. The second control signal lags the first control signal. In other words, the first control signal is activated high when the voltage of the first reference bit line discharges to a first predetermined level, so as to confirm a signal development time. The second control signal is activated high when the voltage of the second reference bit line is discharged to a second predetermined level so as to start read, program verification or erase verification.

BRIEF DESCRIPTION OF THE SEVERAL VIEWS OF THE DRAWINGS

The invention will be described according to the appended drawings.

DETAILED DESCRIPTION OF THE INVENTION

Figure 4:
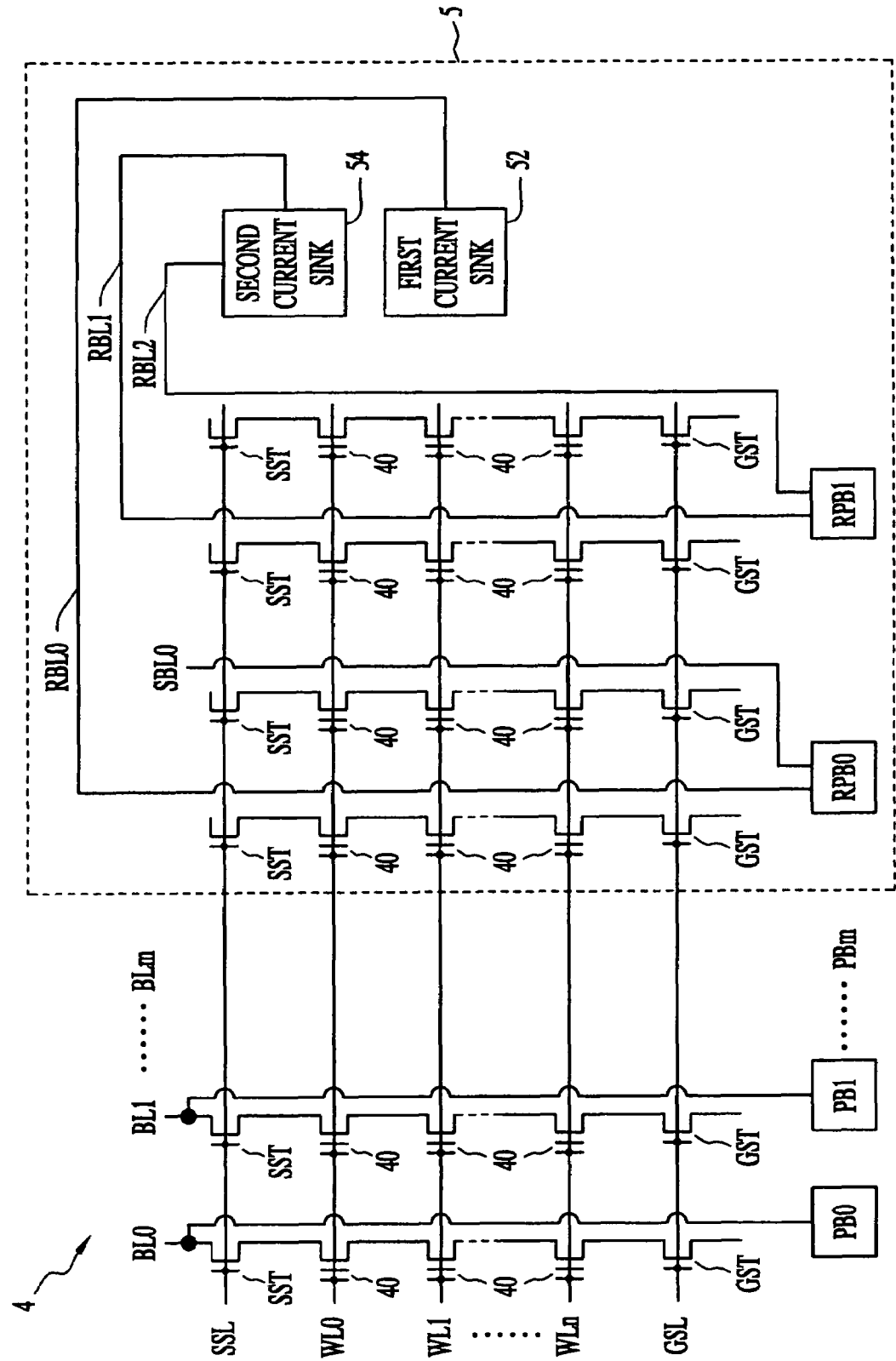
FIG. 4 illustrates a schematic view of a memory cell array associated with the apparatus of the present invention.

FIG. 4 illustrates a memory cell array 4 of a NAND flash memory device configured with the automatic sensing-time determining apparatus 5. The memory cell array 4 contains a string select line SSL, a ground source line GSL, a plurality of word lines (WL0-WLn) each coupling to a control gate of a plurality of normal cells 40, and a plurality of normal cell bit lines (BL0-BLm) each coupling to the respective string select transistor SST and coupling to the respective page buffer (PB0-PBm) thereof. The automatic sensing-time determining apparatus 5 comprises a first reference bit line RBL0, a second group of reference bit lines RBL1 and RBL2, a first current sink 52, a second current sink 54, a first reference page buffer RPB0 and a second reference page buffer RPB1. The first reference bit line RBL0 is coupled to the first current sink 52 and the first reference page buffer RPB0 at both ends thereof. The second group of reference bit lines RBL1 and RBL2 are coupled to the second current sink 54 and the second reference page buffer RPB1 at both ends thereof. The physical layout of each of the reference bit lines (RBL0, SBL0, RBL1 and RBL2) is identical to that of each of the normal cell bit lines (BL0-BLm) by the same manufacturing processes except that there is no connection between the reference bit line and the source electrode of the associated string select transistor SST. Thus, the parameter variation (for example, RC variation) of the reference bit lines and the normal cell bit lines caused by temperature or other factors will cancel each other. Additionally, to eliminate the drifting of the threshold voltages of the reference cells (not shown) inside the first and second current sinks 52, 54 during program or erase operations, both the first and second current sinks 52, 54 are disposed out of the memory cell array 4 and are located at the farthest end of the respective reference bit line from the respective reference page buffer. In addition, the first and second current sinks 52, 54 are the only paths to ground of the first reference bit line RBL0 and the second group of reference bit lines RBL1 and RBL2, respectively. The automatic sensing-time determining apparatus 5 further comprises a first reference shielding bit line SBL0 coupled to the first reference page buffer RPB0 and being a shield to the first reference bit line RBL0. During operation, if the second reference bit line RBL1 is selected to be discharged through the second current sink 54, the third reference bit line RBL2 is grounded through the second reference page buffer RPB1 to shield the second reference bit line RBL1, and vice versa. In other words, the RBL1 can be grounded to shield the RBL2 if RBL2 is elected to be discharged through the second current sink 54.

Figure 5C:
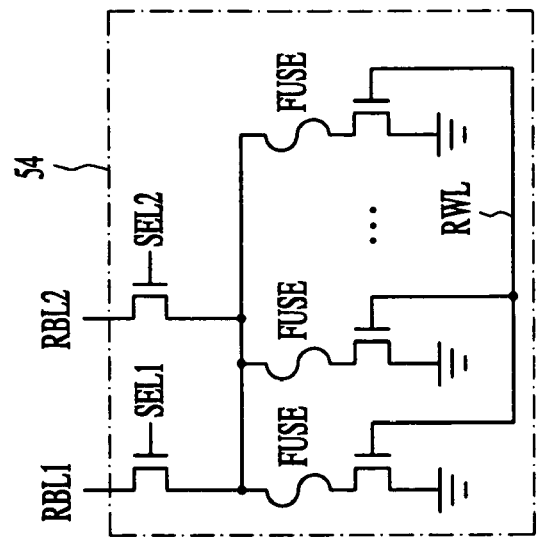
FIGS. 5(c) and 5(d) illustrate schematic views of two embodiments of the second current sink of the present invention.
Figure 5D:
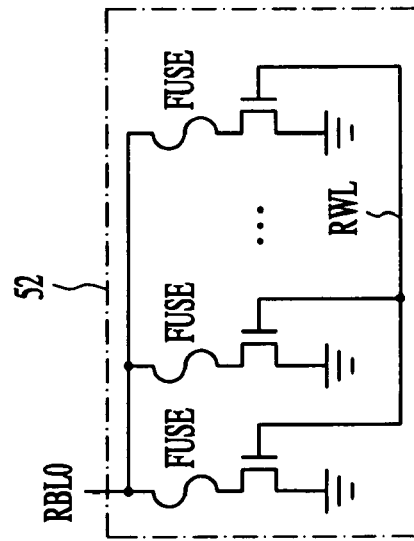
Figure 5A:
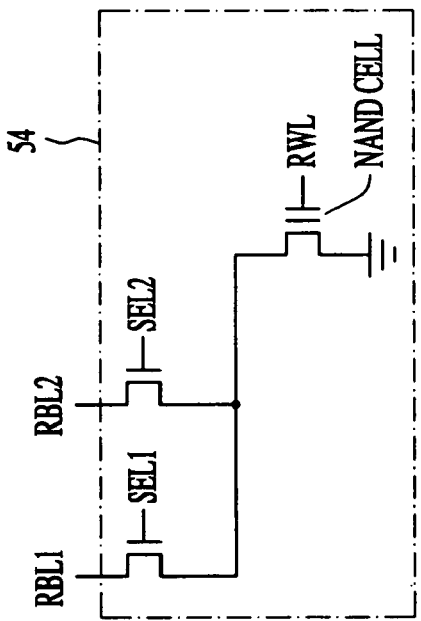
FIGS. 5(a) and 5(b) illustrate schematic views of two embodiments of the first current sink of the present invention.
Figure 5B:
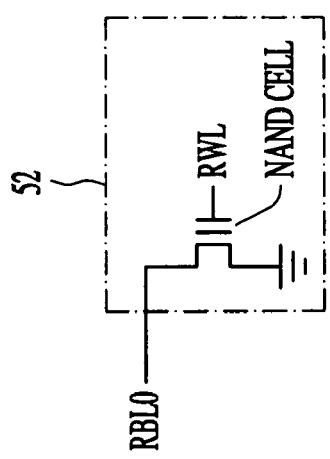

FIGS. 5(a) and 5(b) illustrate two embodiments of the first current sink 52. In FIG. 5(a), the first current sink 52 is implemented by a single NAND cell with a control gate connected to a reference word line RWL. The threshold voltage of the reference cell is tunable and the reference word line RWL is active only during read and verification operations (including program verification and erase verification). In addition, the reference word line RWL is isolated from the normal cell word lines; therefore, there is no disturbance concern. When read or verification operation is started, the control signals to the normal cell page buffers (PB0-PBm) will start and the control signals to the first and second reference page buffers RPB0 and RPB1 start also. Then, the first and second reference page buffers RPB0 and RPB1 will output the signals to the normal cell page buffers (PB0-PBm) to sense the data stored in the normal cells 40. Accordingly, the output signals of the first and second reference page buffers RPB0 and RPB1, which serve as control signals inputted to the circuit of FIG. 2 such as PLOAD, PBLCHM and PBLCHC, are active automatically and no timer is needed to control the activating timing of the output signals. In FIG. 5(b), the first current sink 52 is implemented by a plurality of fuse groups each connected to a MOSFET in series and the fuse groups are connected in parallel with a reference word line RWL connected to gate electrodes of the MOSFETs.

FIG. 5(c) and FIG. 5(d), showing similar structures to FIG. 5(a) and FIG. 5(b), respectively, illustrate two embodiments of the second current sink 54 with two additional control signals SEL1, SEL2. The operation of the two control signals SEL1 and SEL2 is described as follows. When SEL1 MOSFET is turned on and SEL2 MOSFET is turned off, the second reference bit line RBL1 will discharge through the second current sink 54 and the third reference bit line RBL2 is grounded through the second reference page buffer RPB1 to act as a shield to the second reference bit line RBL1. Similarly, the second reference bit line RBL1 is grounded through the second reference page buffer RPB1 to act as a shield to the third reference bit line RBL2 when SEL1 MOSFET is turned off and SEL2 MOSFET is turned on.

Figure 1:
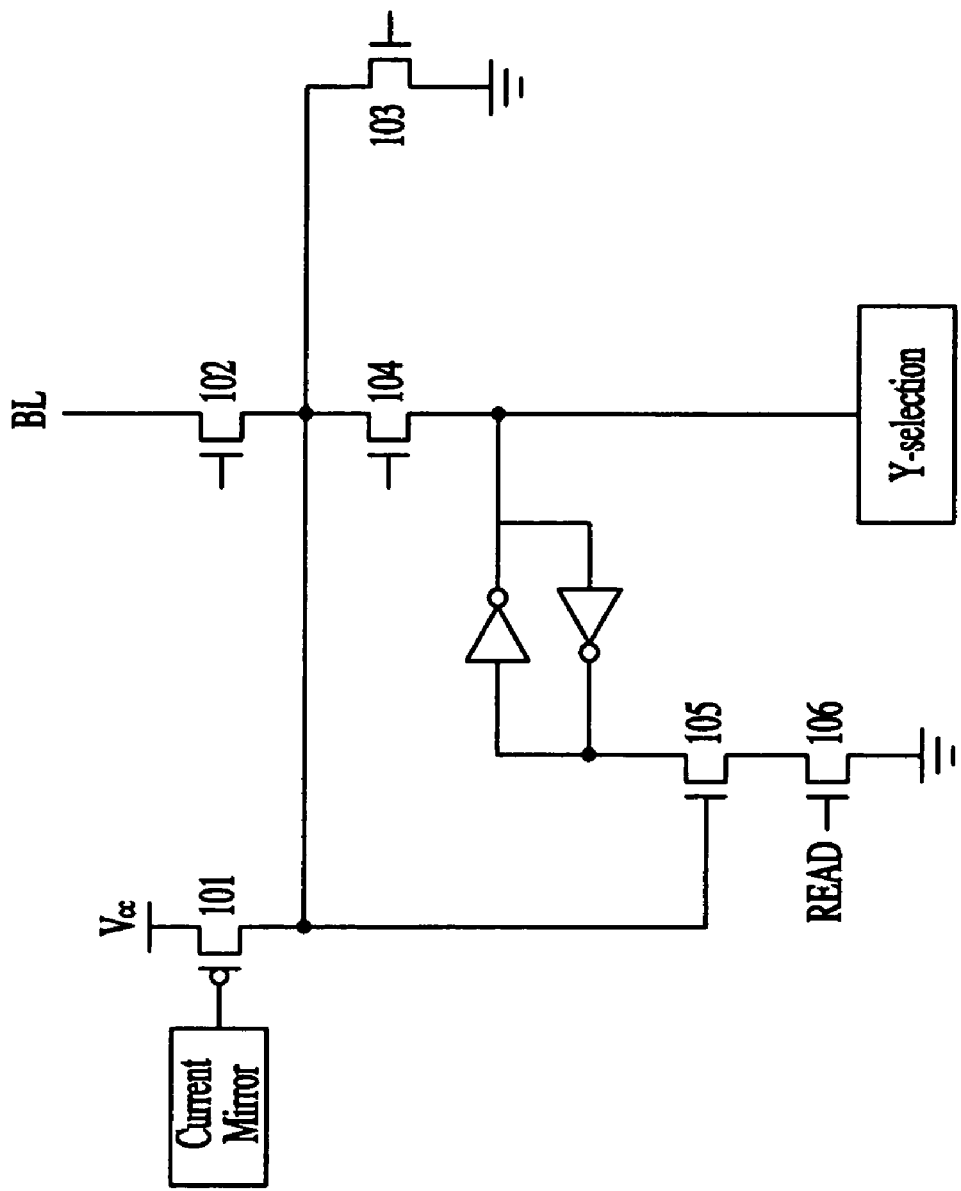
FIG. 1 shows a schematic view of a conventional page buffer circuit diagram of a NAND flash memory.
Figure 2:
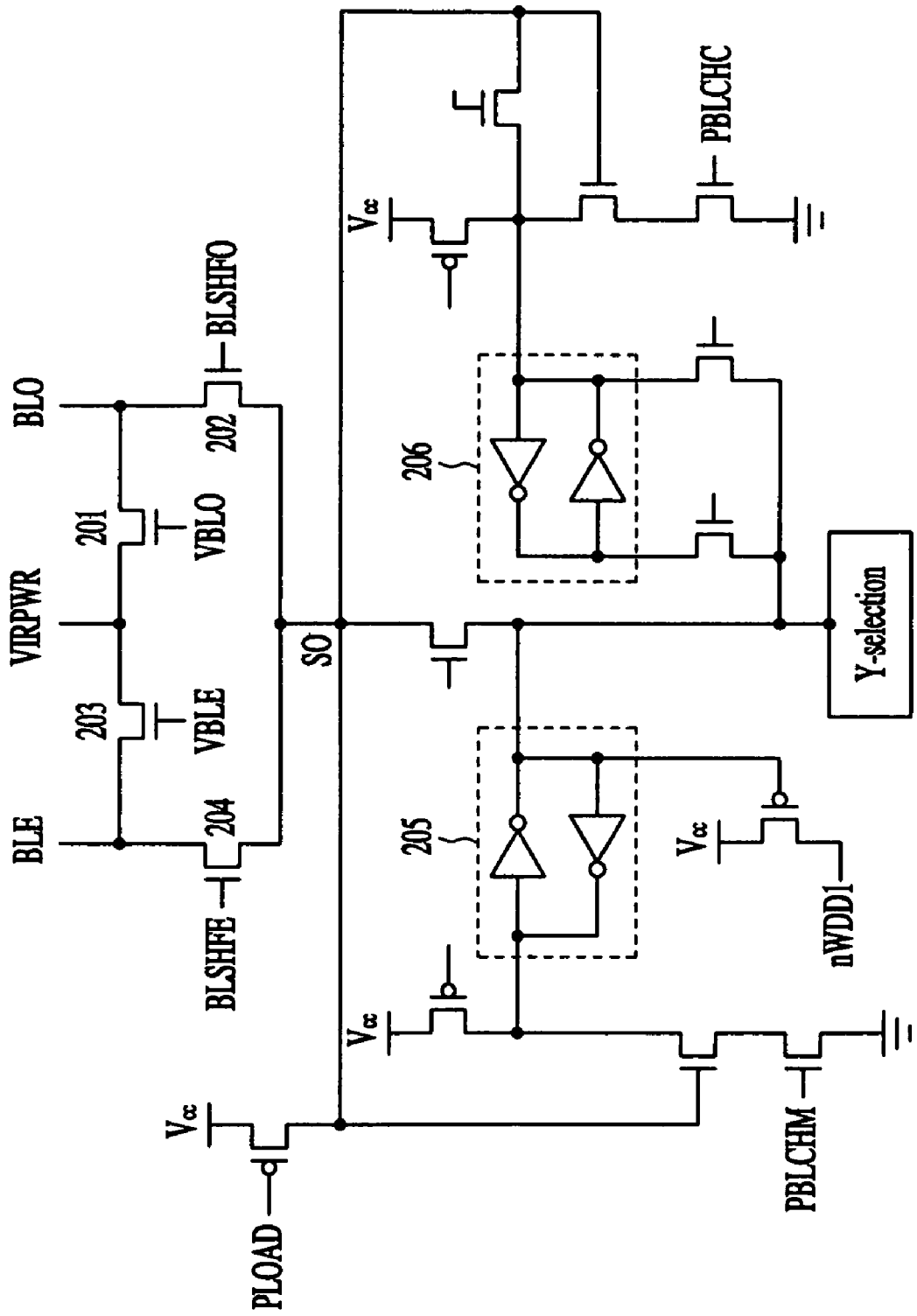
FIG. 2 shows another schematic view of a conventional page buffer circuit diagram of a NAND flash memory.
Figure 3:
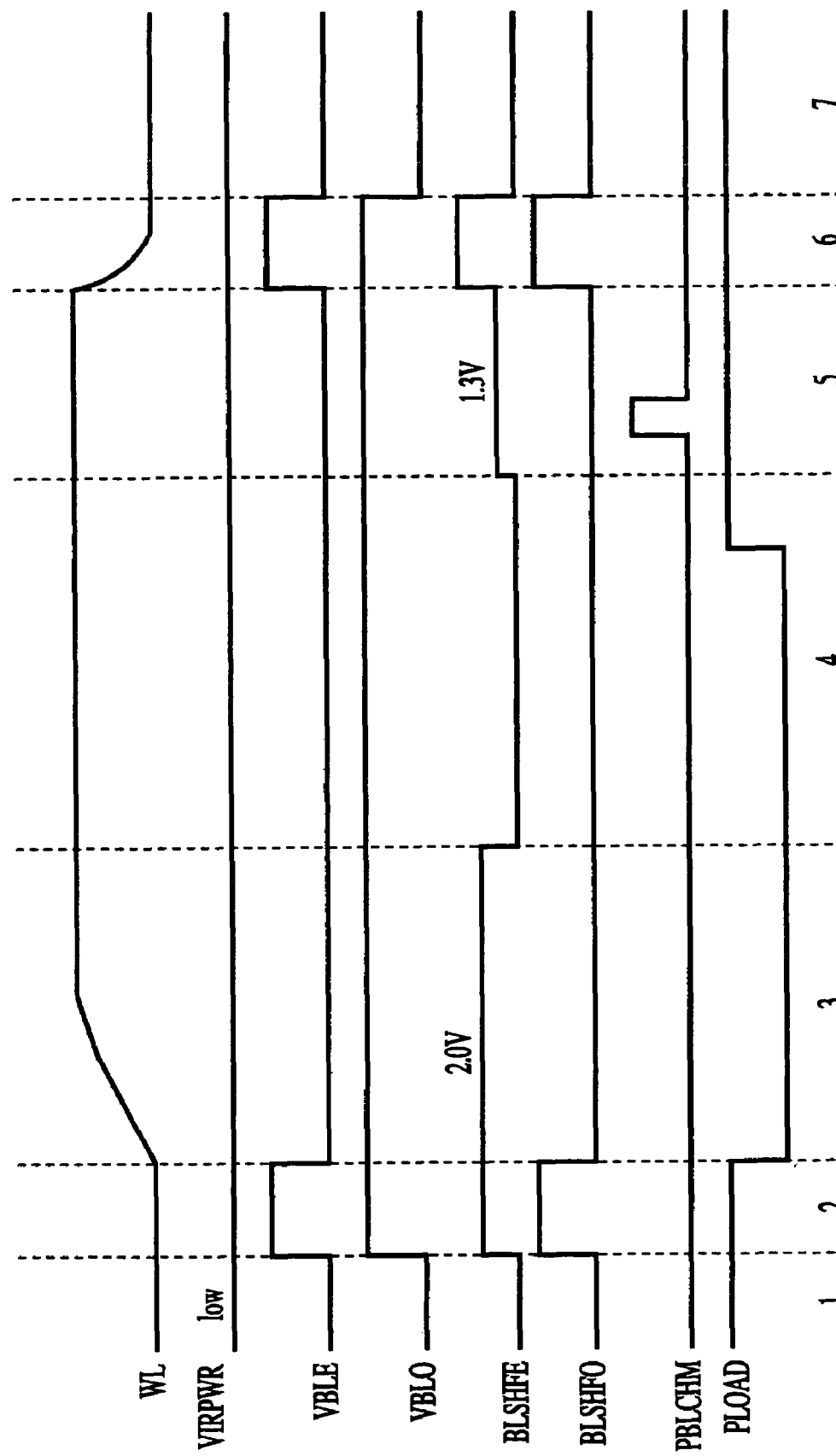
FIG. 3 is a schematic view of a timing diagram of read operation of FIG. 2.
Figure 6:
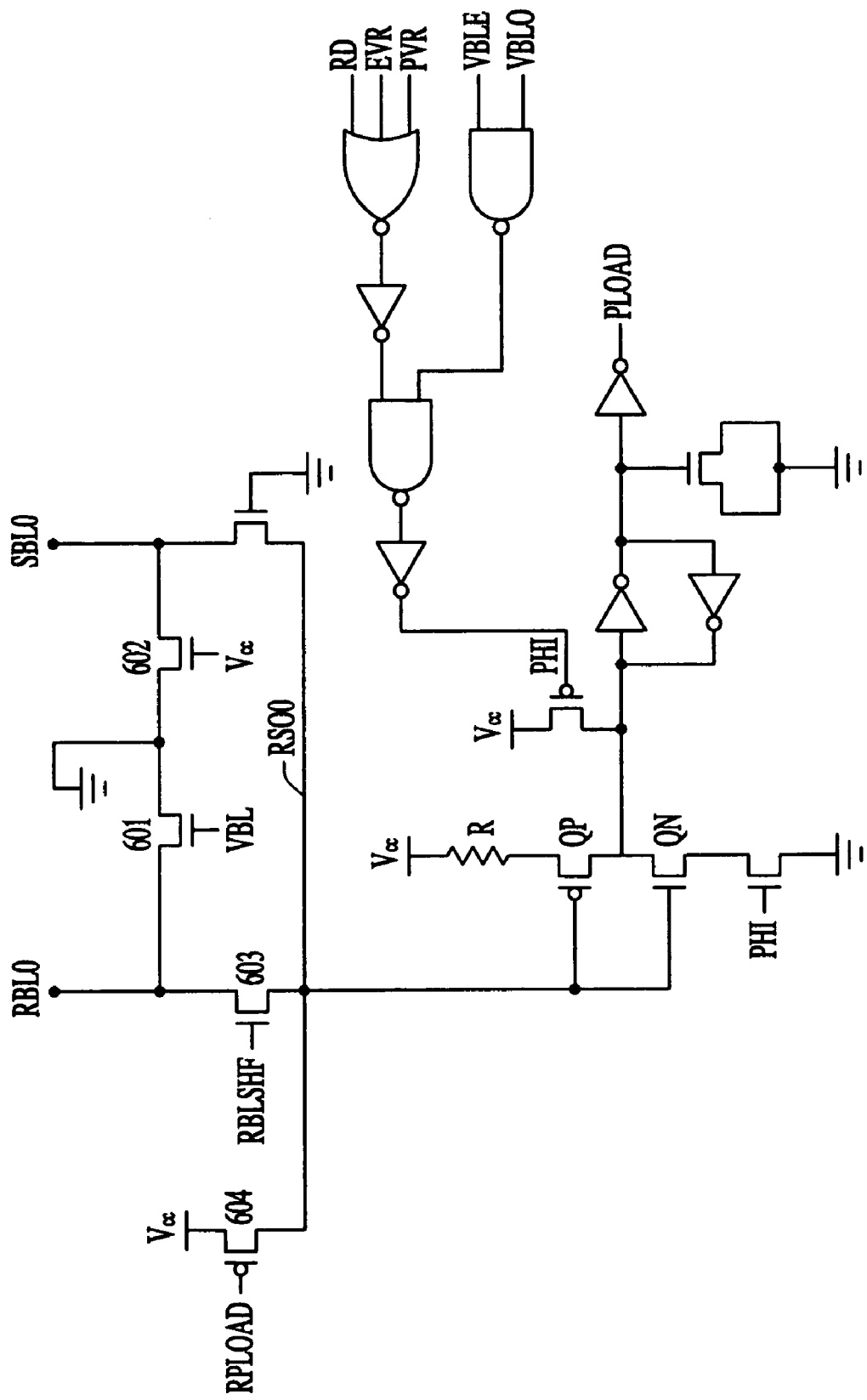
FIG. 6 illustrates a schematic view of an embodiment of a circuit of the first reference page buffer of the present invention.
Figure 7:
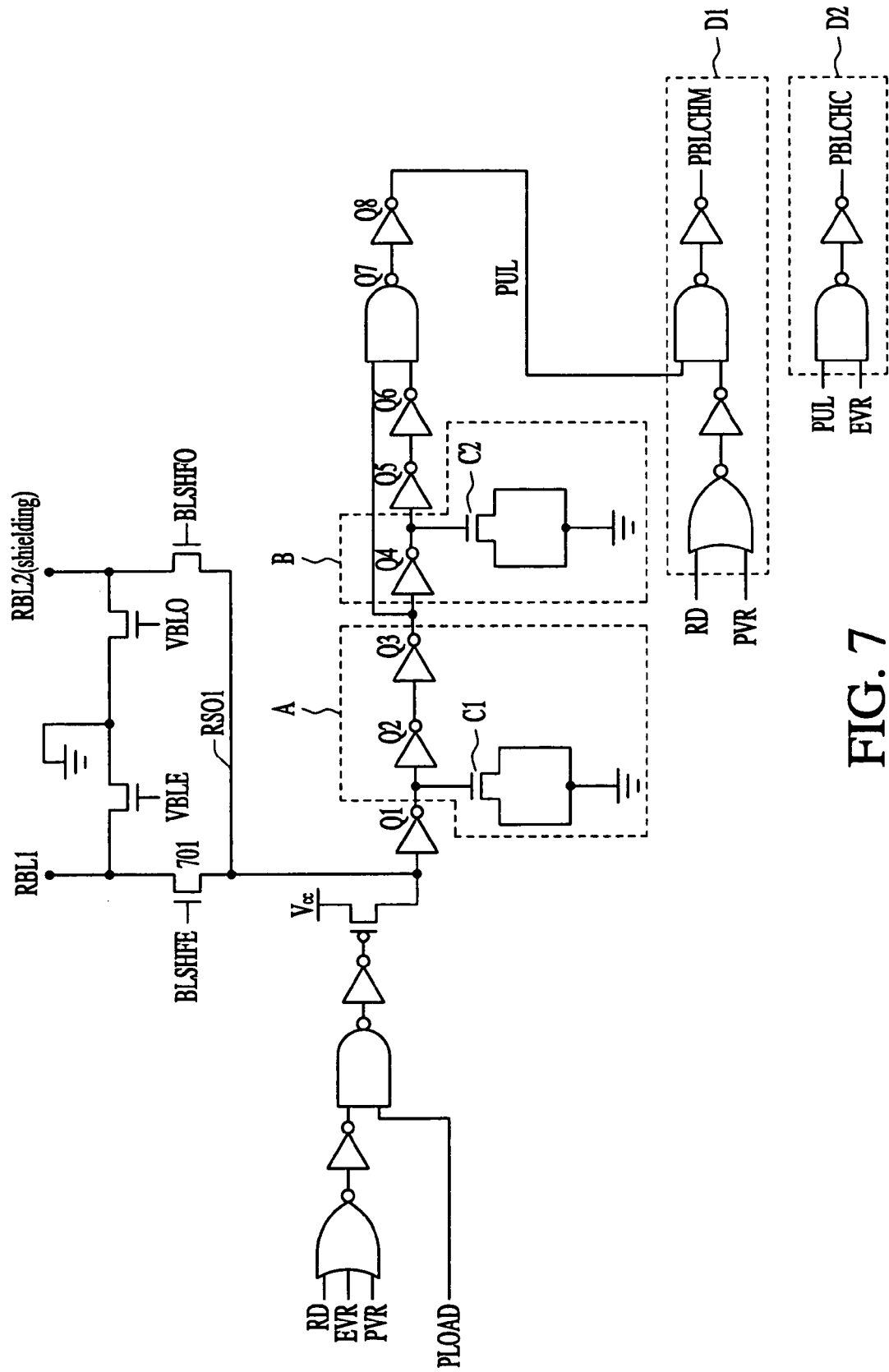
FIG. 7 illustrates a schematic view of an embodiment of a circuit of the second reference page buffer of the present invention.

FIG. 6 illustrates an embodiment of a circuit of the first reference page buffer RPB0, which is used to determine the timing of the first control signal (e.g., PLOAD of FIG. 2) switching to logic high, i.e., the end of the signal development time. FIG. 7 illustrates an embodiment of a circuit of the second reference page buffer RPB1, which is used to determine when the second control signal (e.g., PBLCHM or PBLCHC of FIG. 2) switches to logic high, i.e., the sensing timing to start the read operation, program verification or erase verification). As shown in FIGS. 2, 6 and 7, both the first control signal and the second control signal of the present invention are provided to a page buffer comprises two registers.

Figure 8:
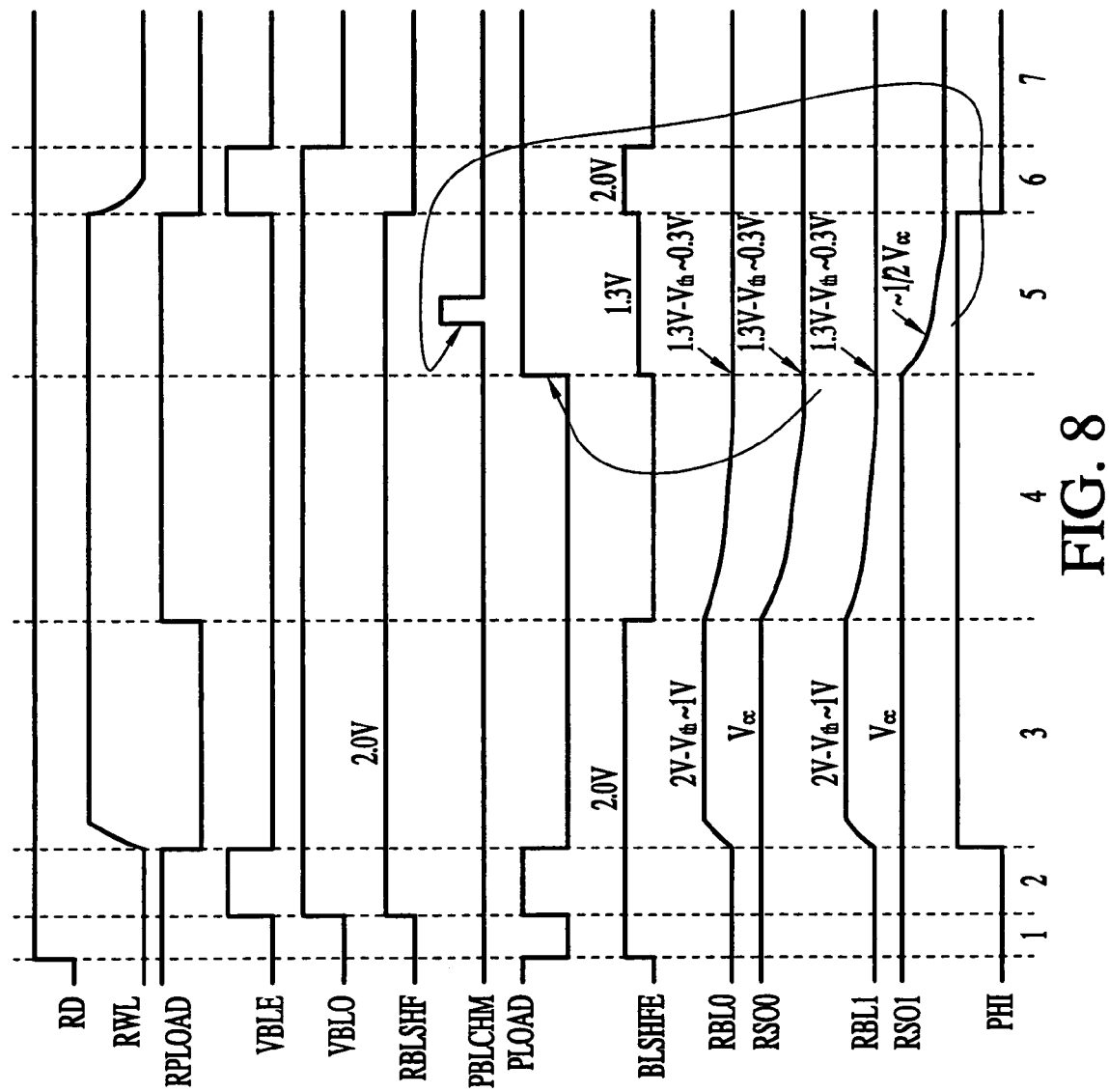
FIG. 8 is a schematic view of a timing diagram of the read operation of FIG. 4.

The following is the detailed description of FIG. 6 with reference to FIG. 8 that illustrates a timing diagram in accordance with the present invention. VBL is designed as VBLE waveform in FIG. 2 whatever even or odd bit line is selected. In Region 2 of FIG. 8, the first reference bit line RBL0 is discharged to ground first by turning on NMOS 601. Turning on NMOS 603 also discharges the node RSO0. Then, Region 3 is active during which RBLSHF keeps at 2.0V and RPLOAD is pulled to logic low. Because the node RSO0 is pulled to $V_{CC}$ by turning on PMOS 604 and PHI is at logic high, and an inverter consisting of QP and QN transistors senses a high level input, PLOAD is pulled to logic low according to the logic of FIG. 6. In the meantime, the first reference bit line RBL0 will stabilize at about 1V with RWL logic high to discharge the first reference bit line RBL0 through the first current sink 52. Then, Region 4 is active during which RPLOAD switches to logic high to turn off the controlled PMOS 604. At this time, RWL is logic high to make the first reference bit line RBL0 grounded through the first current sink 52. Thus the node RSO0 starts to discharge to the first reference bit line RBL0 through NMOS 603. When the voltage levels of the node RSO0 and the first reference bit line RBL0 are discharged to a first predetermined level, e.g., 0.3V, the inverter consisting of the QP and QN transistors will sense the low level of the node RSO0 and toggle the output phase to high, and thus PLOAD switches to logic high again; that is, the signal development time ends. It means the normal cell bit line is discharged to about the first predetermined level for the accessed cell with low threshold voltage, and the signal of the node SO (refer to FIG. 2) is ready to be connected to the normal cell bit line. This state is kept in Region 6 during which PHI goes logic low. The signals RD (read), EVR (erase verification) and PVR (program verification) are provided to confirm that the initial state of PLOAD is logic high.

Regarding FIG. 7, the detailed description is given below, for which the third reference bit line RBL2 serves as a shielding and the second reference bit line RBL1 is selected. The signal SEL1 (refer to FIG. 5) is always active in the case of FIG. 7. After PLOAD goes high at the end of Region 4, Region 5 is active during which the node RSO1 will be connected to the second reference bit line RBL1. That is, when the second reference bit line RBL1 is discharged through the second current sink 54 to a second predetermined level, e.g., 0.3V, MOS 701 will be turned on and the node RSO1 will be discharged from $V_{CC}$. When the node RSO1 reaches about $0.5V_{CC}$, an inverter Q1 will sense a low level input so as to output a signal PUL. The signal PUL is associated with signals RD and PVR as inputs to a circuit D1 so as to output a PBLCHM pulse signal for activating the read or program verification operation (refer to FIGS. 7 and 9 of U.S. Pat. No. 6,671,204). Alternatively, the signal PUL can be associated with the signal EVR as inputs to a circuit D2 so as to output a PBLCHC pulse signal for activating the erase verification (refer to FIG. 16 of U.S. Pat. No. 6,671, 204). A circuit "A" including a capacitor C1, inverters Q2 and Q3 is optional and is used to delay the activation of the pulse signal PBLCHM or PBLCHC. A circuit "B" including a capacitor C2 and an inverter Q4 is used to determine the pulse width of the PBLCHM or PBLCHC. As shown in FIG. 7, the second control signal PBLCHM (or PBLCHC) depends on the state of the first control signal PLOAD and the voltage level associated with the second reference bit line RBL1, which is the voltage level of the node RSO1.

In a NAND flash memory, the normal cells need to be erased and programmed. Erase and program verifications perform like read operation, and consequently the method of the present invention can be applied to all the above-mentioned operations. For example, in FIG. 2, the signal PBLCHM is active during read or program verification (refer to FIGS. 9 and 7 of U.S. Pat. No. 6,671,204) and the signal PBLCHC is active during erase verification (refer to FIG. 16 of U.S. Pat. No. 6,671,204).

The circuits of FIGS. 6 and 7 combined with the circuit of FIG. 4 are used to activate the control signals PLOAD, PBLCHM and PBLCHC automatically, precisely and without a timer. In addition, the method and apparatus of the present invention can omit the step of simulation of determining the sensing timing, and the cases of operations under extreme environment (abnormal temperature or voltage) does not need to be considered during circuit design of the NAND flash memory device. The present invention also achieves the elimination of the drifting of threshold voltage of reference cells during program or erase operations.

The above-described embodiments of the present invention are intended to be illustrative only. Numerous alternative embodiments may be devised by those skilled in the art without departing from the scope of the following claims.

I claim:

1. A method for determining a sensing time of a flash memory device being comprised of a page buffer and normal cells in a memory cell array, said method comprising the steps of:
    discharging a first reference bit line coupled to a first reference page buffer through a first current sink;
    discharging a second reference bit line coupled to a second reference page buffer through a second current sink;
    generating a first control signal when the first reference bit line reaches a first pre-determined voltage; and
    generating a second control signal when the second reference bit line reaches a second pre-determined voltage;
    wherein generating the second control signal depends on generating of the first control signal and the voltage level of a node coupled to the second reference bit line, the first and second control signals being provided to the page buffer, and time of generating the second control signal determining sensing time.

2. The method for determining a sensing time of a flash memory device of claim 1, wherein the second control signal is used to start read, program verification or erase verification.

3. The method for determining a sensing time of a flash memory device of claim 1, further comprising a step of:
    grounding a first reference shielding bit line coupled to the first reference page buffer so as to shield the first reference bit line when shielding bit line scheme is used for normal bit line.

4. The method for determining a sensing time of a flash memory device of claim 1, further comprising a step of:
    grounding a third reference bit line coupled to the second reference page buffer so as to shield the second reference bit line when shielding bit line scheme is used for normal bit line.

5. The method for determining a sensing time of a flash memory device of claim 1, further comprising a step of:
    grounding the second reference bit line to shield a third reference bit line coupled to the second reference page buffer when shielding bit line scheme is used for normal bit line.

6. The method for determining a sensing time of a flash memory device of claim 1, wherein the physical layout of the first or second reference bit line is identical to that of a bit line of the normal cell.

7. The method for determining a sensing time of a flash memory device of claim 1, wherein the first current sink or the second current sink comprises a NAND cell whose control gate is connected to a reference word line.

8. The method for determining a sensing time of a flash memory device of claim 7, wherein the reference word line is active when read, program verification or erase verification.

9. The method for determining a sensing time of a flash memory device of claim 7, wherein the second current sink further comprises two transistors respectively in series connected to the second reference bit line and a third reference bit line for shielding control.

10. The method for determining a sensing time of a flash memory device of claim 1, wherein the first or second current sink comprises a plurality of fuse groups each connected to a transistor in series, and the fuse groups are connected in parallel with a reference word line connected to gate electrodes of the transistors.

11. The method for determining a sensing time of a flash memory device of claim 10, wherein the second current sink further comprises two transistors respectively in series connected to the second reference bit line and a third reference bit line for shielding control.

12. The method for determining a sensing time of a flash memory device of claim 1, wherein the flash memory device is a NAND flash memory.

13. The method for determining a sensing time of a flash memory device of claim 1, wherein the first and second current sinks are placed out of the memory cell array.

14. An apparatus for determining a sensing time of a flash memory device being comprised of a page buffer and normal cells in a memory cell array, said apparatus comprising:
    a first current sink;
    a second current sink;
    a first reference page buffer;
    a second reference page buffer;
    a first reference bit line coupled between the first current sink and the first reference page buffer; and
    a second reference bit line coupled between the second current sink and the second reference page buffer;
    wherein the first and second reference bit lines are respectively discharged to be a first pre-determined voltage and a second pre-determined voltage through the first and second current sinks so as to determine a first control signal and a second control signal, wherein generation of the second control signal depends on generation of the first control signal and the voltage level of a node coupled to the second reference bit line, and wherein the first and second control signals are provided to the page buffer.

15. The apparatus for determining a sensing time of a flash memory device of claim 14, wherein the first or second current sink comprises a NAND cell whose control gate is connected to a reference word line.

16. The apparatus for determining a sensing time of a flash memory device of claim 15, wherein the reference word line is isolated from the normal word lines of the normal cells.

17. The apparatus for determining a sensing time of a flash memory device of claim 14, further comprising:
a first reference shielding bit line connected to first reference page buffer for shielding the first reference bit line.

18. The apparatus for determining a sensing time of a flash memory device of claim 17, wherein the first reference shielding bit line is grounded when shielding the first reference bit line.

19. The apparatus for determining a sensing time of a flash memory device of claim 14, further comprising:
a third reference bit line coupled between the second reference page buffer and the second current sink for shielding the second reference bit line.

20. The apparatus for determining a sensing time of a flash memory device of claim 19, wherein the third reference bit line is grounded when shielding the second reference bit line.

21. The apparatus for determining a sensing time of a flash memory device of claim 14, wherein the physical layout of the first or second reference bit line is identical to that of a bit line of the normal cell.

22. The apparatus for determining a sensing time of a flash memory device of claim 14, wherein the first or second current sink comprises a plurality of fuse groups each connected to a transistor in series, and the fuse groups are connected in parallel with a reference word line connected to gate electrodes of the transistors.

23. The apparatus for determining a sensing time of a flash memory device of claim 22, wherein the second current sink further comprises two transistors respectively in series connected to the second reference bit line and a third reference bit line for shielding control.

24. The apparatus for determining a sensing time of a flash memory device of claim 14, wherein the first and second current sinks are placed out of the memory cell array.

25. The apparatus for determining a sensing time of a flash memory device of claim 24, wherein the first current sink and the second current sink are placed at the farthest end from the first and second reference page buffers, respectively.

26. The apparatus for determining a sensing time of a flash memory device of claim 14, wherein the flash memory device is a NAND flash memory.

* * * * *